(12) United States Patent
Price, Jr.

(10) Patent No.: US 6,181,496 B1
(45) Date of Patent: Jan. 30, 2001

(54) MAGNETIC RECORDING CONTROL CIRCUIT WITH VOLTAGE CLAMPS

(75) Inventor: John J. Price, Jr., Edina, MN (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/286,889

(22) Filed: Apr. 6, 1999

Related U.S. Application Data

(60) Provisional application No. 60/082,322, filed on Apr. 20, 1998.

(51) Int. Cl.[7] ............................... G11B 5/09; G11B 5/02; H03B 1/00
(52) U.S. Cl. ............................... 360/46; 360/68; 327/110
(58) Field of Search ........................ 360/46, 68; 327/110, 327/180, 309

(56) References Cited

U.S. PATENT DOCUMENTS

| | | | |
|---|---|---|---|
| 5,132,852 | 7/1992 | Price, Jr. ............................... | 360/46 |
| 5,287,231 | 2/1994 | Shier et al. ............................. | 360/68 |
| 5,291,347 | 3/1994 | Ngo et al. .............................. | 360/68 |
| 5,532,631 | 7/1996 | Ngo et al. .............................. | 327/110 |
| 5,612,828 | 3/1997 | Brannon et al. ........................ | 360/46 |
| 5,751,171 | 5/1998 | Ngo ....................................... | 327/110 |
| 5,757,215 | 5/1998 | Schuelke et al. ..................... | 327/110 |
| 5,781,046 | 7/1998 | Ngo et al. .............................. | 327/110 |
| 5,880,626 | 5/1999 | Dean ..................................... | 327/552 |
| 5,894,237 | 4/1999 | Brannon et al. ....................... | 327/110 |

*Primary Examiner*—W. Chris Kim
(74) *Attorney, Agent, or Firm*—Kinney & Lange, P.A.

(57) ABSTRACT

A magnetic recording control circuit for controlling current through a magnetic recording head includes a switch network, a signal coupler, and first and second voltage clamps. The switch network is connected to first and second magnetic recording head node regions and includes first, second, third, and fourth switches each having a variable magnitude conduction path and a control region. The signal coupler includes an input region and a plurality of output regions each connected to the control region of a corresponding switch. The first and second voltage clamps limit voltage differences between the magnetic recording head node regions and the control regions of the first and second switches.

12 Claims, 4 Drawing Sheets

MAGNETIC RECORDING CONTROL CIRCUIT WITH VOLTAGE CLAMPS

CROSS-REFERENCE TO RELATED APPLICATIONS

This application claims priority from Provisional Application No. 60/082,322, filed Apr. 20, 1998 for "H-Switch Speedup and Breakdown Prevention" by John J. Price, Jr.

BACKGROUND OF THE INVENTION

The present invention relates to a magnetizing current control circuit which operates with a magnetic recording head in a magnetic data storage and retrieval system. In particular, the present invention relates to a magnetizing current control circuit having improved switching performance and circuit component voltage breakdown prevention.

In magnetic data storage and retrieval systems, a magnetic recording head records two-logic-state data to a magnetic data storage medium, such as a magnetic tape or magnetic disc. The magnetic recording head has an inductive coil with currents provided therethrough in alternate directions, representing the data, to impart a series of alternate magnetic field patterns over time to the magnetic medium moving by it. Producing alternate magnetic field patterns over time entails switching the electric current through the inductive coil between forward and reverse directions therethrough to correspond to the data. Current flowing through the inductive coil generates a magnetic field oriented in a direction corresponding to the direction of flow through the coil; thus, reversing the direction of current reverses the orientation of the magnetic field. The magnetic fields generated by the inductive coil currents intersect the magnetic medium to polarize adjacent magnetic medium regions which in effect serve as data symbol storage positions on the medium and so form magnetic patterns along a corresponding one of more or less concentric tracks in the medium from which an information signal can be retrieved.

Controlling the directions of currents through the inductive coil is the purpose of a magnetizing current control circuit. A typical magnetizing current control circuit includes a switching network and a signal coupler. The switching network is connected to the ends of the inductive coil in the magnetic recording head at first and second head nodes, and includes four switching transistors arranged as pairs with each pair member connected to a corresponding one of these head nodes. One pair is switched on directing current flow in one direction through the inductive coil with the other pair switched off and, alternatively, this latter pair is switched on to direct current flow through the inductive coil in the opposite direction with the first pair being switched off. More specifically, the switching transistors are connected to the inductive coil such that a first switching transistor is connected between a first electrical power source and the first head node, a second switching transistor is connected between the first electrical power source and the second head node, a third switching transistor is connected between the first head node and a second electrical power source, and a fourth switching transistor is connected between the second head node and the second electrical power source.

The signal coupler, which responds to input signals, provides control signals to selectively switch the four switching transistors on and off in pairs, thereby controlling the direction of current through the inductive coil. Specifically, to direct current in one direction through the inductive coil, the signal coupler switches on the first and fourth switching transistors and switches off the second and third switching transistors. Conversely, to direct current in the opposite direction through the inductive coil, the signal coupler switches off the first and fourth switching transistors and switches on the second and third switching transistors.

One principle concern in the performance of magnetizing current control circuits is the duration of time needed to complete a switching of current direction through the inductive coil which directly affects the switching rate. Switching rate, a measure of how often the magnetizing current control circuit can reverse current direction through the inductive coil per unit of time, determines the maximum linear spatial density of data along a track in the magnetic medium. Ultimately, a higher switching rate yields denser data storage and thus greater total data capacity for a magnetic medium.

A key determinant of the current reversal switching time duration is the head swing voltage, i.e. the voltage difference between the head nodes of the magnetizing current control circuit. The larger the voltage drop applied in the opposite direction across the inductive coil after a switching to reverse the current therethrough, the quicker the change in direction of current through the inductive coil. This is because the voltage-current characteristic of an inductive coil is determined by $V=Ldi/dt+R_L I$, where V is the voltage across the inductive coil, di/dt is the rate of change of current over time through the inductive coil, L is the inductance of the inductive coil, $R_L$ is the resistance of the inductive coil, and I is the current through the inductive coil. Because the inductance of the inductive coil is constant and the resistance of the inductive coil is relatively small, there is a direct relationship between the voltage impressed across the inductive coil after switching and the rate of change of current over time through the inductive coil.

In typical magnetizing current control circuits, the head swing voltage is equal to the voltage difference between the emitters of the first and second switching transistors. In order to create a large voltage difference between the emitters of the first and second switching transistors after a switching to reverse the current through the inductive coil, a similarly large voltage difference is applied to the bases of the first and second switching transistors. After the direction of current changes through the inductive coil, the voltage difference between the emitters of the first and second switching transistors (which is equal to the head swing voltage) decreases to nearly zero while the voltage difference between the bases of the first and second switching transistors remains constant. As a result, the remainder of the large voltage difference between the bases of the first and second switching transistors is compensated by the base-emitter pn junction of either the first or second switching transistor. However, the base-emitter pn junctions of the switching transistors have a low breakdown voltage. Exceeding the breakdown voltage allows a reverse current to flow through these base-emitter pn junctions, and over time sufficiently degrades the current gain of the switching transistors, thereby reducing current to the magnetic recording head and ultimately the magnetic strength of the data it records to a magnetic medium. To avoid exceeding the breakdown voltage of these base-emitter pn junctions it is typically necessary to sacrifice switching rate by limiting head swing voltage (e.g. limiting the voltage difference between the first and second electrical power sources).

Accordingly, there is a need for a magnetizing current control circuit that prevents breakdown of the first and second switching transistors without diminishing the head swing voltage.

BRIEF SUMMARY OF THE INVENTION

The present invention is a magnetic recording control circuit for controlling current through a magnetic recording head. A switch network is connected to first and second magnetic recording head node regions and includes first, second, third, and fourth switches each having a variable magnitude conduction path and a control region. A signal coupler includes an input region and a plurality of output regions each connected to the control region of a corresponding switch. First and second voltage clamps limit voltage differences between the magnetic recording head node regions and the control regions of the first and second switches. In one preferred embodiment, each of the switches and voltage clamps are bipolar junction transistors having a collector, an emitter, and a base.

DETAILED DESCRIPTION

Figure 1:
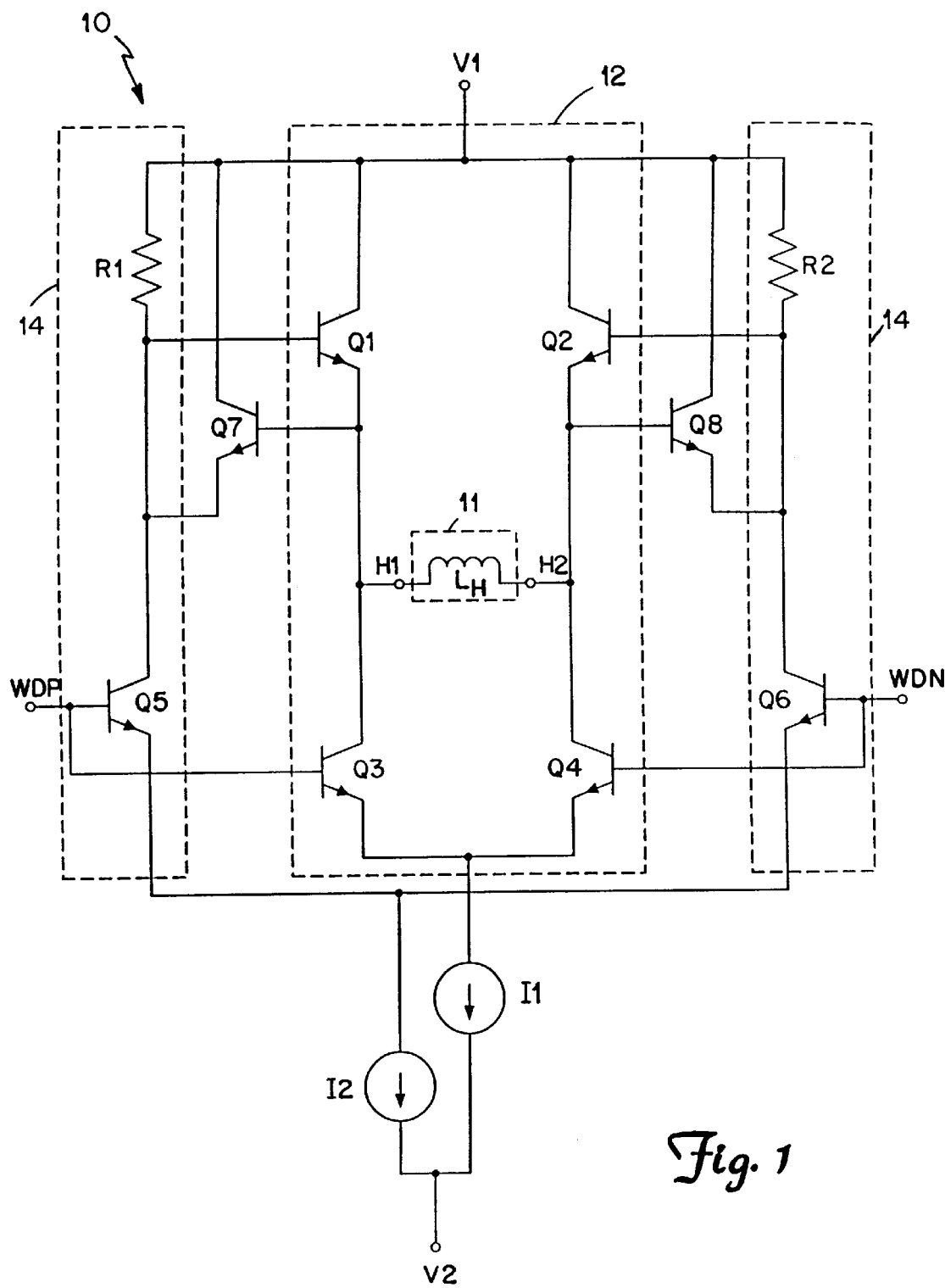
FIG. 1 shows a circuit schematic diagram of a magnetic recording control circuit embodying the present invention.

FIG. 1 shows a circuit schematic diagram of a magnetic recording control circuit 10 embodying the present invention. Magnetic recording control circuit 10 controls the magnitude and direction of current through a magnetic recording head 11 represented in the diagram as an inductive coil $L_H$. Magnetic recording head 11, which is coupled into the remainder of the circuit between circuit head nodes H1 and H2, includes inductive coil $L_H$ along with magnetic material positioned in magnetic fields generated by current there through. Magnetic recording control circuit 10 includes a switching network 12, a signal coupler 14 in two separate sections, voltage clamping transistors Q7 and Q8, operating voltage source nodes V1 and V2, current generators I1 and I2, input signal circuit nodes WDP and WDN, and the circuit head nodes H1 and H2 previously mentioned.

Switching network 12 includes switching transistors Q1–Q4. Switching transistors Q1–Q4 are npn bipolar junction transistors each having a collector, an emitter, and a base. Each of switching transistors Q1 and Q2 has its collector connected to operating voltage source node V1 and the emitter of each is connected to a corresponding one of head nodes H1 and H2. Each of switching transistors Q3 and Q4 has its collector connected to a corresponding one of head nodes H1 and H2 and the emitter of each is connected to one side of current generator I1, the other side of which is connected to operating voltage source node V2. The bases of switching transistors Q1–Q4 are each connected to a corresponding one of the outputs of signal coupler 14.

Signal coupler 14 includes switching transistors Q5 and Q6 and resistors R1 and R2. Switching transistors Q5 and Q6 are npn bipolar junction transistors each having a collector, an emitter, and a base. Input signal nodes WDP and WDN are directly connected respectively to the bases of switching transistors Q5 and Q6 in signal coupler 14 and to the bases of switching transistors Q3 and Q4 in switching network 12. Each of switching transistors Q5 and Q6 has its emitter connected to one side of current generator I2, and the collector of each is connected to operating voltage source node V1 through a corresponding one of resistors R1 and R2. The other side of current generator I2 is connected to operating voltage source node V2.

Voltage clamping transistors Q7 and Q8 are npn bipolar junction transistors each having a collector, an emitter, and a base. Each of voltage clamping transistors Q7 and Q8 has its collector connected to operating voltage source node V1. Also, the emitter of each is connected to the base of a corresponding one of switching transistors Q1 and Q2, and the base of each is connected to a corresponding one of head nodes H1 and H2.

In an initial input signal situation chosen for purposes of description, input signal node WDN has a significantly higher voltage than input signal node WDP, for example. In the steady state, with the initial input signal so as to result in the voltage at WDN being greater than that at WDP, switching transistor Q5 in signal coupler 14 will be found to be turned off, switching transistor Q6 in signal coupler 14 will be found to be turned on, switching transistors Q1 and Q4 in switching network 12 will be found to be turned on, switching transistors Q2 and Q3 in switching network 12 will be found to be turned off, voltage clamping transistor Q7 will be found to be turned off, and voltage clamping transistor Q8 will be found to be turned on. The voltages at head nodes H1 and H2 will be found to be approximately V1−VBE, as the base current of switching transistor Q1 is small and the resistance of inductive coil $L_H$ is low (VBE is the voltage drop across the base-emitter pn junction of switching transistor Q1). Current I1 will be found to be drawn from operating voltage source node V1, primarily through the collector and emitter of switching transistor Q1, through magnetic recording head 11 from head node H1 to H2, through the collector and emitter of switching transistor Q4, through current generator I1, and into operating voltage source node V2. Current I2 will be found to be drawn from operating voltage source node V1, primarily through resistor R2 and the collector and emitter of voltage clamping transistor Q8, through the collector and emitter of switching transistor Q6, through current generator I2, and into operating voltage source node V2.

When the input signal on nodes WDP and WDN is subsequently changed to then have a significantly higher voltage at input signal node WDP than at input signal node WDN, signal coupler 14 passes this change therethrough to turn on switching transistor Q3 in switching network 12 and to turn off switching transistor Q4 in switching network 12. In addition, in this circumstance, switching transistor Q5 in signal coupler 14 is turned on and switching transistor Q6 in signal coupler 14 is turned off, thereby drawing an increased current through resistor R1 (because voltage clamping transistor Q7 remains initially still turned off as it was prior to the change at input signal nodes WDP and WDN) and reducing the current drawn through resistor R2. This condition causes the voltage at the base of switching transistor Q1 to initially drop to approximately V1−R1I2 and the voltage at the base of switching transistor Q2 to rise toward operating source voltage V1. With switching transistor Q3 turned on and the voltage at the base of switching transistor Q1 (which remains initially still turned on as it was prior to the change at input signal nodes WDP and WDN) approximately V1−R1I2, the voltage at the emitter of switching transistor Q1 is approximately V1−R1I2−VBE, where VBE is the voltage drop across the base-emitter pn junction of switching transistor Q1. In addition, when the voltage at the base of switching transistor Q2 begins to rise toward operating source voltage V1, voltage clamping transistor Q8 is turned off because the voltage at the emitter of voltage clamping transistor Q8 (which is equal to the voltage at the base of switching transistor Q2) is no longer a VBE lower than the voltage at its base (which is equal to the voltage at head node H2 and is still approximately V1−VBE as it was prior to the change at input signal nodes WDP and WDN). When the voltage at the base of switching transistor Q2 is approximately at operating source voltage V1, switching transistor Q2 is turned on because the base of switching transistor Q2 is then a VBE higher than the voltage at its emitter (which is equal to the voltage at head node H2).

Because the voltage at head node H1 (which is equal to the voltage at the emitter of switching transistor Q1) is approximately V1−R1I2−VBE and the voltage at head node H2 is approximately V1−VBE, a voltage drop of approximately R1I2 volts is initially created across inductive coil $L_H$ from head node H2 to H1. As a result, current I1 (which, prior to the change at input signal nodes WDP and WDN, was flowing through inductive coil $L_H$ from head node H1 to H2) will follow the change in polarity across inductive coil $L_H$ and ultimately change direction and flow through inductive coil $L_H$ from head node H2 to H1.

After the change in direction of current I1 through inductive coil $L_H$ so that current I1 now flows from head node H2 to H1, the voltage at head node H1 will rise to nearly the voltage at head node H2. This is because once the direction of current I1 is established, the rate of change of current I1 will decrease to nearly zero and cause the voltage across inductive coil $L_H$ to also decrease to nearly zero because the resistance of inductive coil $L_H$ is relatively small. Also, the voltage at head node H2 is held approximately constant during the remainder of this input signal situation because the voltage drop VBE across the base-emitter pn junction of switching transistor Q2 (which is turned on) is approximately constant and the voltage drop across resistor R2 is small because of the gain of switching transistor Q2. Therefore, as the voltage difference between head nodes H2 and H1 decreases to nearly zero, the voltage at head node H1 will rise to nearly the voltage at head node H2.

When the voltage at head node H1(which is equal to the voltage at the emitter of switching transistor Q1) begins to rise from V1−R1I2−VBE with the decreasing voltage across inductive coil $L_H$, switching transistor Q1 will be turned off because the voltage at the emitter of switching transistor Q1 is no longer a VBE lower than the voltage at its base (which is held at approximately V1−R1I2 by transistor Q5 being turned on). As the voltage at head node H1 continues to rise toward V1−VBE (which is the voltage at head node H2), it will eventually be a VBE higher than the voltage at the base of switching transistor Q1. When this occurs, voltage clamping transistor Q7 is turned on because the voltage at the base of voltage clamping transistor Q7 (which is equal to the voltage at head node H1) is a VBE higher than the voltage at its emitter (which is equal to the voltage at the base of switching transistor Q1). For the remainder of this input signal situation after voltage clamping transistor Q7 is turned on, as the voltage at head node H1 rises, voltage clamping transistor Q7 causes the voltage at the collector of switching transistor Q5 and so at the base of switching transistor Q1 to also rise. This is because the rising voltage at the base of voltage clamping transistor Q7 forces its emitter voltage to rise through drawing an increased current through the collector and emitter of voltage clamping transistor Q7 to supply some of the collector current to switching transistor Q5 which reduces the current drawn through R1 so that the voltage thereacross decreases. As a result, voltage clamping transistor Q7 limits the voltage difference between head node H1 and the base of switching transistor Q1 to a VBE, where VBE is the voltage drop across the base-emitter pn junction of voltage clamping transistor Q7. Thus, when the voltage at head node H1 is nearly V1−VBE (which is the voltage at head node H2), the voltage at the base of switching transistor Q1 is approximately V1−2VBE.

Therefore, because switching transistors Q2 and Q3 are turned on and switching transistors Q1 and Q4 are turned off with the voltage at node WDP exceeding that at node WDN, current I1 is drawn from operating voltage source node V1, primarily through the collector and emitter of switching transistor Q2, through magnetic recording head 11 from head node H2 to H1, through the collector and emitter of switching transistor Q3, through current generator I1, and into operating voltage source node V2. As described above, the voltage at the collector of switching transistor Q5 and the base of switching transistor Q1 is also raised in this situation by voltage clamping transistor Q7 from approximately V1−R1I2 to nearly within a VBE of the voltage at head node H2. voltage at the collector of switching transistor Q5, in starting closer to operating source voltage V1, rises to voltage V1 more quickly when the input signal situation is subsequently reversed to the voltage at node WDN exceeding that at node WDP. This is because switching transistor Q5 has at its collector inherent structural and other associated, or parasitic, capacitances which require charging or discharging during switching and prevent the voltage at the collector of switching transistor Q5 from instantaneously rising to operating voltage V1. Also, because voltage clamping transistor Q7 keeps the voltage at the emitter of switching transistor Q1 (which is equal to the voltage at head node H1) a VBE higher than the voltage at the base of switching transistor Q1, switching transistor Q1 is held off without any possibility that the breakdown voltage of the base-emitter pn junction of switching transistor Q1 will be exceeded because it is greater than a VBE.

Figure 2:
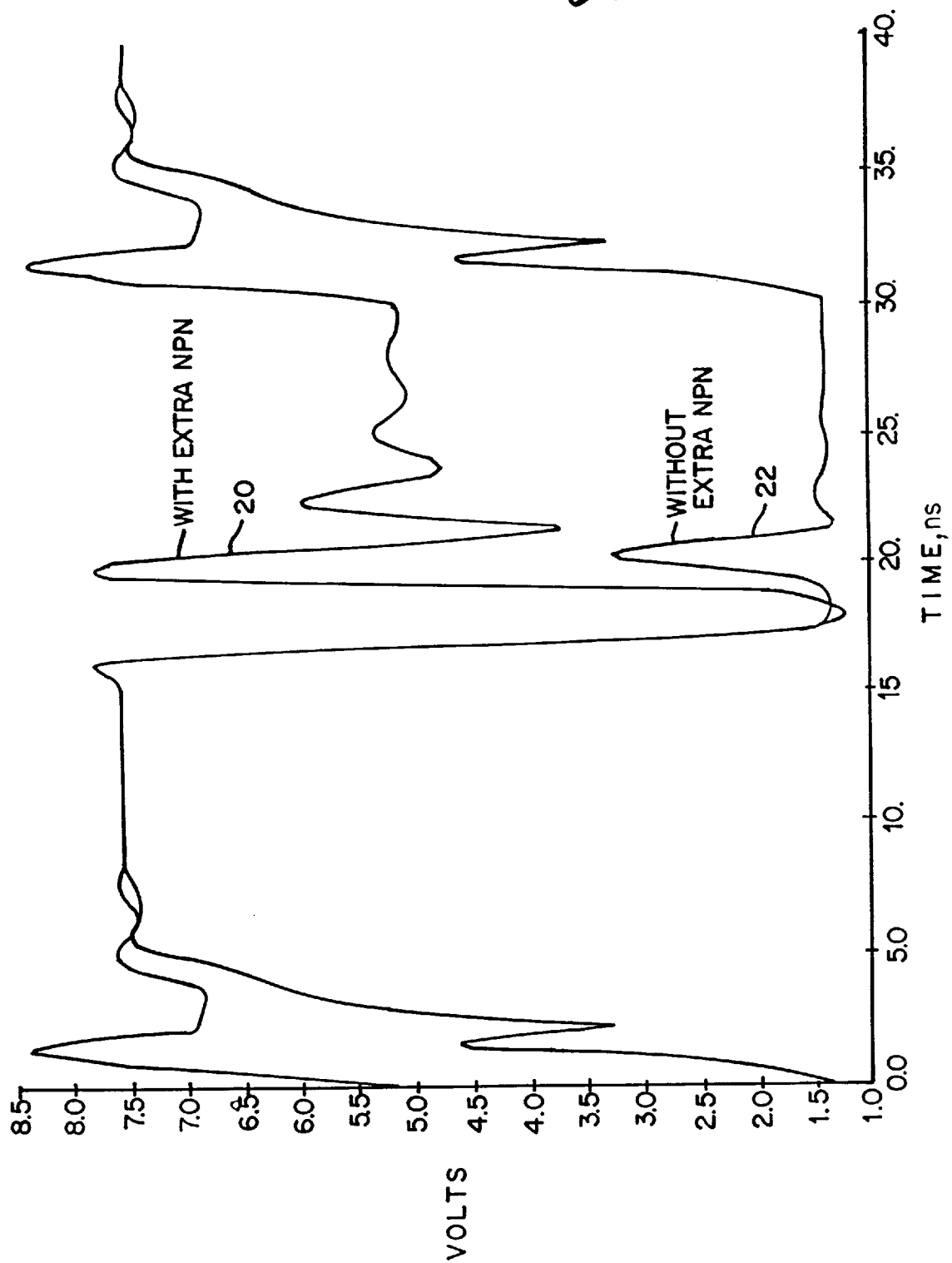
FIG. 2 shows a voltage waveform plot of the voltage at the base of the first switching transistor in the magnetic recording control circuit of FIG. 1.

Waveform 20 in FIG. 2 shows the voltage waveform at the base of switching transistor Q1 during both input signal relative magnitude situations. Waveform 22 shows the voltage waveform at the same location in a magnetic recording control circuit without the presence of voltage clamping transistors Q7 and Q8. The start of an input signal situation in which the voltage at node WDN changes from exceeding that at node WDP to the opposite condition begins at 15 ns and ends at 30 ns in FIG. 2. Waveform 22 shows that without voltage clamping transistors Q7 and Q8, the voltage at the base of switching transistor Q1 drops below 1.5 V and, after a short voltage increase, remains low until the next change in the input signal. Waveform 20 shows that with voltage clamping transistors Q7 and Q8, the voltage at the base of switching transistor Q1 also drops below 1.5 V but then has a short voltage increase to settle at approximately 5.2 V at which value this voltage remains until the next relative magnitude change in the input signal on nodes WDP and WDN.

Figure 3:
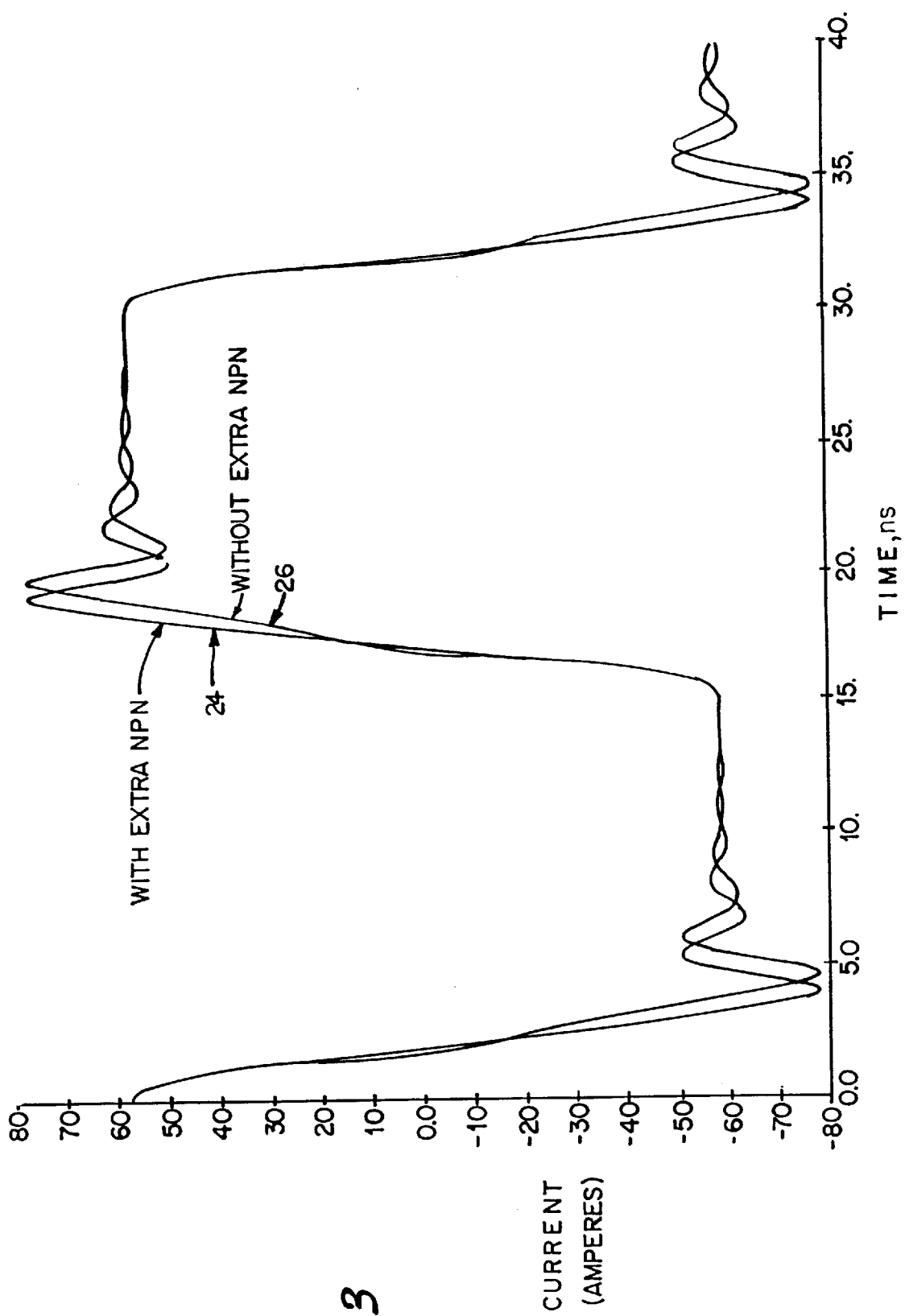
FIG. 3 shows a current waveform plot of the current through an inductive coil connected to the magnetic recording control circuit of FIG. 1.

Waveform 24 in FIG. 3 shows the current through inductive coil $L_H$ from head node H2 to H1 during the same input signal situations depicted in FIG. 2. Waveform 26 shows the current in the same direction through inductive coil $L_H$ in a magnetic recording control circuit without the presence of voltage clamping transistors Q7 and Q8. The start of an input signal situation in which the voltage at node WDN changes from exceeding that at node WDP to the opposite condition begins at 15 ns and ends at 30 ns in FIG. 3. Waveform 26 shows that without voltage clamping transistors Q7 and Q8, the current through inductive coil $L_H$ changes direction and rises to 59 mA at approximately 18.5 ns. Waveform 24 shows that with voltage clamping transistors Q7 and Q8, the current through inductive coil $L_H$ changes direction and rises to 59 mA at approximately 18.0 ns.

Figure 4:
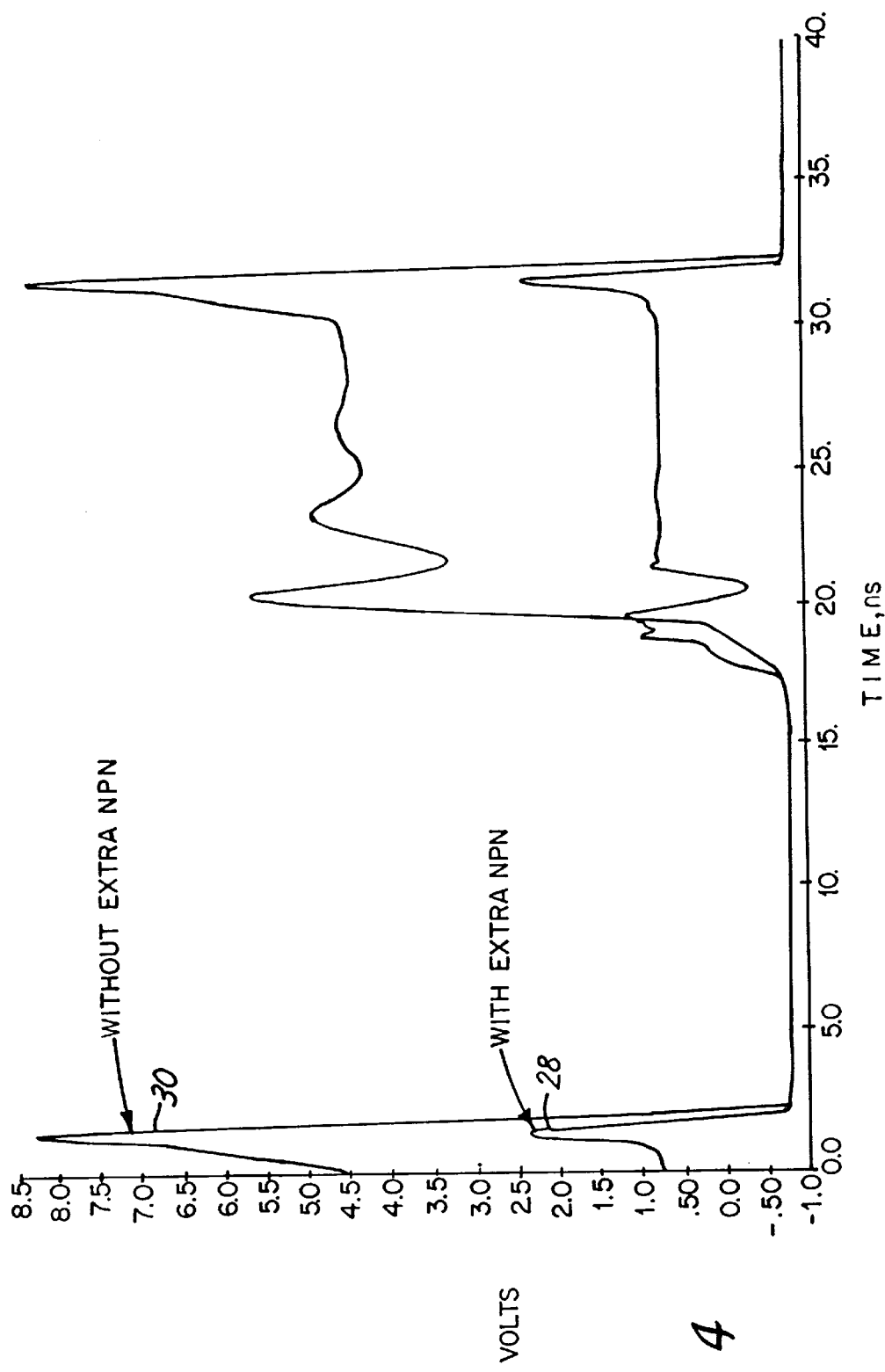
FIG. 4 shows a voltage waveform plot of the voltage between the emitter and the base of the first switching transistor in the magnetic recording control circuit of FIG. 1.

Waveform 28 in FIG. 4 shows the voltage waveform across the emitter-base pn junction of switching transistor Q1 during the same input signal situations depicted in FIG. 2. Waveform 30 shows the voltage waveform at the same location in a magnetic recording control circuit without the presence of voltage clamping transistors Q7 and Q8. The start of an input signal situation in which the voltage at node WDN changes from exceeding that at node WDP to the opposite condition begins at 15 ns and ends at 30 ns in FIG. 4. Waveform 30 shows that without voltage clamping transistors Q7 and Q8, the voltage across the emitter-base pn junction of switching transistor Q1 rises to over 8 V. Waveform 28 shows that with voltage clamping transistors Q7 and Q8, the voltage across the emitter-base pn junction of switching transistor Q1 never exceeds 2.5V.

When the input signal on nodes WDP and WDN is subsequently changed to again have a significantly higher voltage at input signal node WDN than at input signal node WDP as in the initial input signal steady state situation described above, signal coupler 14 passes this change therethrough to turn on switching transistor Q4 in switching network 12 and to turn off switching transistor Q3 in switching network 12. In addition, in this circumstance, switching transistor Q6 in signal coupler 14 is turned on and switching transistor Q5 in signal coupler 14 is turned off, thereby drawing an increased current through resistor R2 (because voltage clamping transistor Q8 remains initially still turned off as it was prior to the change at input signal nodes WDP and WDN) and reducing the current drawn through resistor R1. This condition causes the voltage at the base of switching transistor Q2 to initially drop to approximately V1–R2I2 and the voltage at the base of switching transistor Q1 to rise toward operating source voltage V1. With switching transistor Q4 turned on and the voltage at the base of switching transistor Q2 (which remains initially still turned on as it was prior to the change at input signal nodes WDP and WDN) approximately V1–R2I2, the voltage at the emitter of switching transistor Q2 is approximately V1–R2I2–VBE, where VBE is the voltage drop across the base-emitter pn junction of switching transistor Q2. In addition, when the voltage at the base of switching transistor Q1 begins to rise toward operating source voltage V1, voltage clamping transistor Q7 is turned off because the voltage at the emitter of voltage clamping transistor Q7 (which is equal to the voltage at the base of switching transistor Q1) is no longer a VBE lower than the voltage at its base (which is equal to the voltage at head node H1 and is still approximately V1–VBE as it was prior to the change at input signal nodes WDP and WDN). And when the voltage at the base of switching transistor Q1 is approximately at operating source voltage V1, switching transistor Q1 is turned on because the base of switching transistor Q1 is then a VBE higher than the voltage at its emitter (which is equal to the voltage at head node H1).

Because the voltage at head node H2 (which is equal to the voltage at the emitter of switching transistor Q2) is approximately V1–R2I2–VBE and the voltage at head node H1 is approximately V1–VBE, a voltage drop of approximately R2I2 volts is initially created across inductive coil $L_H$ from head node H1 to H2. As a result, current I1 (which, prior to the change at input signal nodes WDP and WDN, was flowing through inductive coil $L_H$ from head node H2 to H1) will follow the change in polarity across inductive coil $L_H$ and ultimately change direction and flow through inductive coil $L_H$ from head node H1 to H2.

After the change in direction of current I1 through inductive coil $L_H$ so that current I1 now flows from head node H1 to H2, the voltage at head node H2 will rise to nearly the voltage at head node H1. When the voltage at head node H2 (which is equal to the voltage at the emitter of switching transistor Q2) begins to rise from V1–R2I2–VBE with the decreasing voltage across inductive coil $L_H$, switching transistor Q2 will be turned off because the voltage at the emitter of switching transistor Q2 is no longer a VBE lower than the voltage at its base (which is held at approximately V1–R2I2 by transistor Q6 being turned on). As the voltage at head node H2 continues to rise toward V –VBE (which is the voltage at head node H1), it will eventually be a VBE higher than the voltage at the base of switching transistor Q2. When this occurs, voltage clamping transistor Q8 is turned on because the voltage at the base of voltage clamping transistor Q8 (which is equal to the voltage at head node H2) is a VBE higher than the voltage at its emitter (which is equal to the voltage at the base of switching transistor Q2). For the remainder of this input signal situation after voltage clamping transistor Q8 is turned on, as the voltage at head node H2 rises, voltage clamping transistor Q8 causes the voltage at the collector of Q6 and so at the base of switching transistor Q2 to also rise. This is because the rising voltage at the base of voltage clamping transistor Q8 forces its emitter voltage to rise through drawing an increased current through the collector and emitter of voltage clamping transistor Q8 to supply some of the collector current to switching transistor Q6 which reduces the current drawn through R2 so that the voltage thereacross decreases. As a result, voltage clamping transistor Q8 limits the voltage difference between head node H2 and the base of switching transistor Q2 to a VBE, where VBE is the voltage drop across the baseemitter pn junction of voltage clamping transistor Q8. Thus, when the voltage at head node H2 is nearly V1–VBE (which is the voltage at head node H1), the voltage at the base of switching transistor Q2 is approximately V1–2VBE.

Therefore, because switching transistors Q1 and Q4 are turned on and switching transistors Q2 and Q3 are turned off with the voltage at node WDN exceeding that at node WDP, current I1 is drawn from operating voltage source node V1, primarily through the collector and emitter of switching transistor Q1, through magnetic recording head 11 from head node H1 to H2, through the collector and emitter of switching transistor Q4, through current generator I1, and into operating voltage source node V2. As described above, the voltage at the collector of switching transistor Q6 and the base of switching transistor Q2 is also raised in this situation by voltage clamping transistor Q8 from approximately V1–R2I2 to nearly within a VBE of the voltage at head node H1. As a result, the voltage at the collector of switching transistor Q6, in starting closer to operating source voltage V1, rises to operating source voltage V1 more quickly when the input signal situation is subsequently reversed to the voltage at node WDP exceeding that at node WDN. This is because switching transistor Q6 has at its collector inherent structural and other associated, or parasitic, capacitances which require charging or discharging during switching and prevent the voltage at the collector of switching transistor Q6 from instantaneously rising to operating voltage V1. Also, because voltage clamping transistor Q8 keeps the voltage at the emitter of switching transistor Q2 (which is equal to the voltage at head node H2) a VBE higher than the voltage at the base of switching transistor Q2, switching transistor Q2 is held off without any possibility that the breakdown voltage of the base-emitter pn junction of switching transistor Q2 will be exceeded because it is greater than a VBE.

Waveform 20 in FIG. 2 shows the voltage waveform at the base of switching transistor Q1 during both input signal relative magnitude situations. Waveform 22 shows the voltage waveform at the same location in a magnetic recording control circuit without the presence of voltage clamping transistors Q7 and Q8. The start of an input signal situation in which the voltage at node WDP changes from exceeding that at node WDN to the opposite condition begins at 0 ns and ends at 15 ns in FIG. 2. Waveform 22 shows that without voltage clamping transistors Q7 and Q8, the voltage at the base of switching transistor Q1 rises to 7.5 V at approximately 6 ns. Waveform 20 shows that with voltage clamping transistors Q7 and Q8, the voltage at the base of switching transistor Q1 rises to 7.5 V at approximately 1 ns.

Waveform 24 in FIG. 3 shows the current through inductive coil $L_H$ from head node H2 to H1 during the input signal situations depicted in FIG. 2. Waveform 26 shows the current in the same direction through inductive coil $L_H$ in a magnetic recording control circuit without the presence of voltage clamping transistors Q7 and Q8. The start of an input signal situation in which the voltage at node WDP changes from exceeding that at node WDN to the opposite condition begins at 0 ns and ends at 15 ns in FIG. 3. Waveform 26 shows that without voltage clamping transistors Q7 and Q8, the current through inductive coil $L_H$ changes direction and drops to –59 mA at approximately 4.0 ns. Waveform 24 shows that with voltage clamping transistors Q7 and Q8, the current through inductive coil $L_H$ changes direction and drops to –59 mA at approximately 3.5 ns.

Waveform 28 in FIG. 4 shows the voltage waveform across the emitter-base pn junction of switching transistor Q1 during the same input signal situations depicted in FIG. 2. Waveform 30 shows the voltage waveform at the same location in a magnetic recording control circuit without the presence of voltage clamping transistors Q7 and Q8. The start of an input signal situation in which the voltage at node WDP changes from exceeding that at node WDN to the opposite condition begins at 0 ns and ends at 15 ns in FIG. 4. Waveform 30 shows that without voltage clamping transistors Q7 and Q8, the voltage across the emitter-base pn junction of switching transistor Q1 rises to over 8 V. Waveform 28 shows that with voltage clamping transistors Q7 and Q8, the voltage across the emitter-base pn junction of switching transistor Q1 never exceeds 2.5 V.

Although the present invention has been described with reference to preferred embodiments, workers skilled in the art will recognize that changes may be made in form and detail without departing from the spirit and scope of the invention.

What is claimed is:

1. A magnetic recording control circuit for controlling current through a magnetic recording head, the control circuit comprising:

first and second electrical power source node regions for connection to an electrical power source;

first and second magnetic recording head node regions for connection to the magnetic recording head;

at least one input signal node region for receiving input signals;

a switch network comprising:

a first switch having a conduction path between first and second conduction path regions which are connected in series between the first electrical power source node region and the first magnetic recording head node region, the first switch further having a control region responsive to control signals for controlling conduction through the conduction path;

a second switch having a conduction path between first and second conduction path regions which are connected in series between the first electrical power source node region and the second magnetic recording head node region, the second switch further having a control region responsive to control signals for controlling conduction through the conduction path;

a third switch having a conduction path between first and second conduction path regions which are connected in series between the first magnetic recording head node region and the second electrical power source node region, the third switch further having a control region responsive to control signals for controlling conduction through the conduction path; and a fourth switch having a conduction path between first and second conduction path regions which are connected in series between the second magnetic recording head node region and the second electrical power source node region, the fourth switch further having a control region responsive to control signals for controlling conduction through the conduction path;

a signal coupler having an input region connected to the input signal node region and a plurality of output regions each connected to the control region of a corresponding one of said first, second, third, and fourth switches, wherein the signal coupler provides control signals at the output regions as a function of the received input signals at the input region;

a first voltage clamp connected between the first magnetic recording head node region and the control region of the first switch for limiting voltage differences between the first magnetic recording head node region and the control region of the first switch to a selected value; and a second voltage clamp connected between the second magnetic recording head node region and the control region of the second switch for limiting voltage differences between the second magnetic recording head node region and the control region of the second switch to a selected value.

2. The control circuit of claim 1 and further comprising a current generator connected to the switch network in series between the first and second electrical power source node regions.

3. The control circuit of claim 1 wherein each of the switches are bipolar junction transistors having a collector, an emitter, and a base and wherein the collector is the first conduction path region, the emitter is the second conduction path region, and the base is the control region.

4. The control circuit of claim 1 wherein the signal coupler comprises a coupler switch having a conduction path between first and second conduction path regions which are connected in series between the control region of the first switch and the second electrical power source node region, the coupler switch further having a control region connected to the input region.

5. The control circuit of claim 1 wherein the control region of the third switch is connected to the input region of the signal coupler.

6. The control circuit of claim 1 wherein each of the voltage clamps are semiconductor devices having a semiconductor region.

7. The control circuit of claim 2 wherein the current generator is connected between the second conduction path region of the third switch and the second electrical power source node region.

8. The control circuit of claim 4 and further comprising a current generator connected to the signal coupler in series between the first and second electrical power source node regions.

9. The control circuit of claim 4 and further comprising a resistor connected between the first electrical power source node region and the first conduction path region of the coupler switch.

10. The control circuit of claim 4 wherein the coupler switch is a bipolar junction transistor having a collector, an emitter, and a base and wherein the collector is the first conduction path region, the emitter is the second conduction path region, and the base is the control region.

11. The control circuit of claim 6 wherein:

the first semiconductor device is a bipolar junction transistor having a collector, an emitter, and a base and wherein the collector is connected to the first electrical power source node region, the emitter is connected to the control region of the first switch, and the base is connected to the first magnetic recording head node region; and the second semiconductor device is a bipolar junction transistor having a collector, an emitter, and a base and wherein the collector is connected to the first electrical power source node region, the emitter is connected to the control region of the second switch, and the base is connected to the second magnetic recording head node region.

12. The control circuit of claim 8 wherein the current generator is connected between the second conduction path region of the coupler switch and the second electrical power source node region.

* * * * *